United States Patent [19]

Keizer et al.

[11] 3,949,925

[45] Apr. 13, 1976

[54] OUTER LEAD BONDER

[75] Inventors: Alan S. Keizer, Huntingdon Valley; Hugh R. Harris, Levittown, both of Pa.

[73] Assignee: The Jade Corporation, Huntingdon Valley, Pa.

[22] Filed: Oct. 3, 1974

[21] Appl. No.: 511,835

[52] U.S. Cl. ............... 228/5.5; 228/13; 228/180 R; 228/170; 29/626; 228/6 A
[51] Int. Cl.² ............................................ H05K 3/32
[58] Field of Search ....................... 228/3–6, 180, 228/170, 13; 29/576 S, 577, 588, 591, 626, 628, 471.1, 471.3, 475

[56] References Cited
UNITED STATES PATENTS

| | | | |
|---|---|---|---|
| 3,544,857 | 12/1970 | Byrne et al. | 317/234 |
| 3,689,991 | 9/1972 | Aird | 29/577 |
| 3,698,073 | 10/1972 | Helda | 29/577 |
| 3,724,068 | 4/1973 | Galli | 29/626 |
| 3,793,714 | 2/1974 | Bylander | 29/588 X |
| 3,859,718 | 1/1975 | Noe | 29/591 |

*Primary Examiner*—Al Lawrence Smith
*Assistant Examiner*—K. J. Ramsey
*Attorney, Agent, or Firm*—Seidel, Gonda & Goldhammer

[57] ABSTRACT

Bonding apparatus bonds inner leads on a film carrier to outer leads. Outer lead frame stock and the film carrier bearing the inner leads and dies are fed to the bonding site. A set of inner leads and the die thereto bonded is punched from the film carrier and moved to the bonding position in a manner such that the inner leads are aligned with the outer leads. A bonding tool effects the bond. Thereafter, the next set of outer leads and inner leads and die are advanced to the bonding site.

6 Claims, 12 Drawing Figures

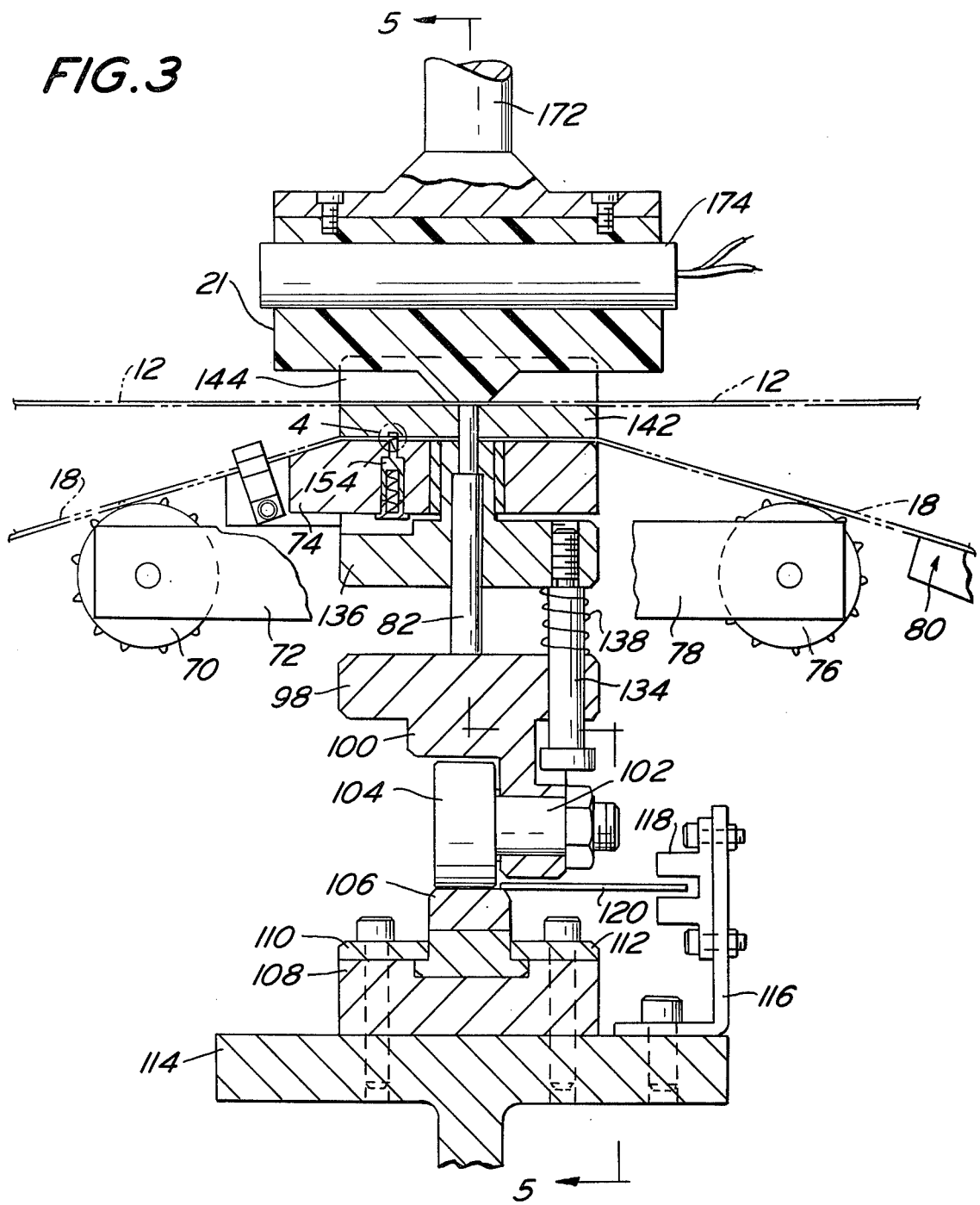

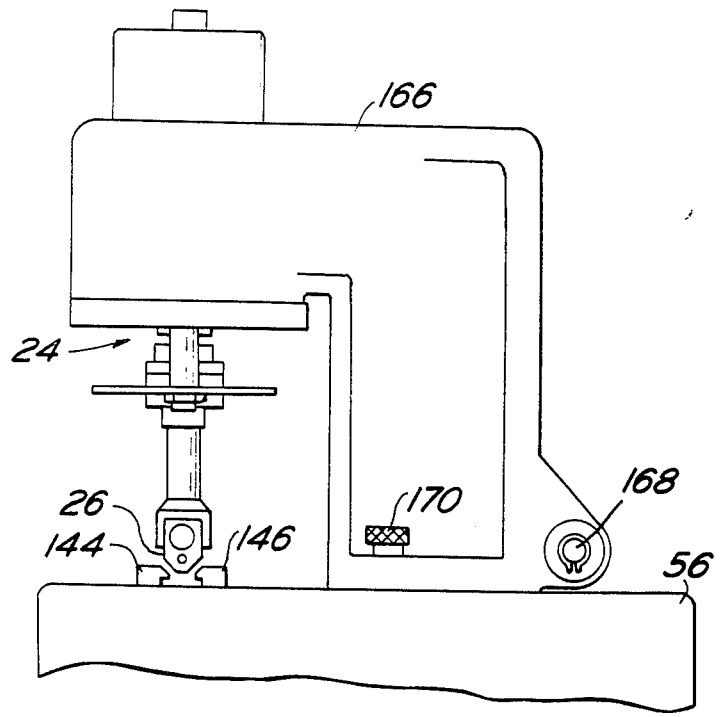
FIG. 9
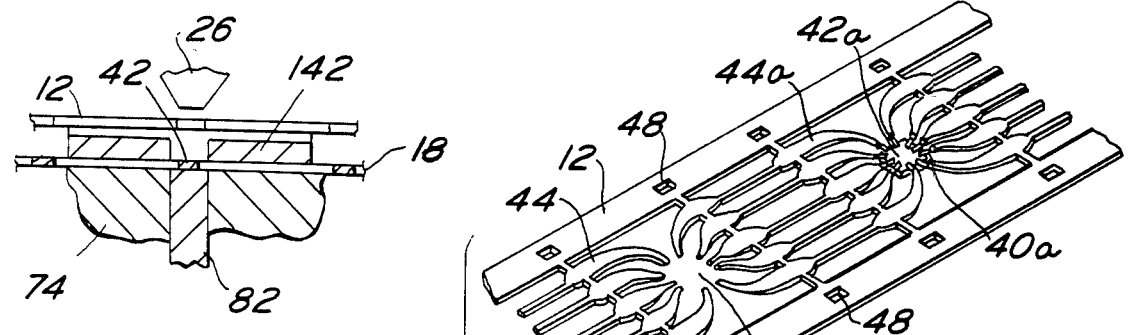
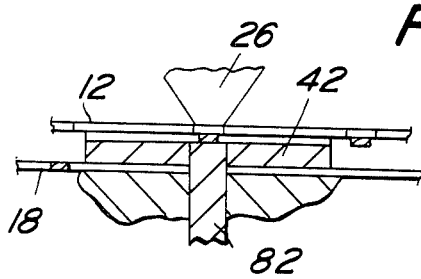
FIG. 10
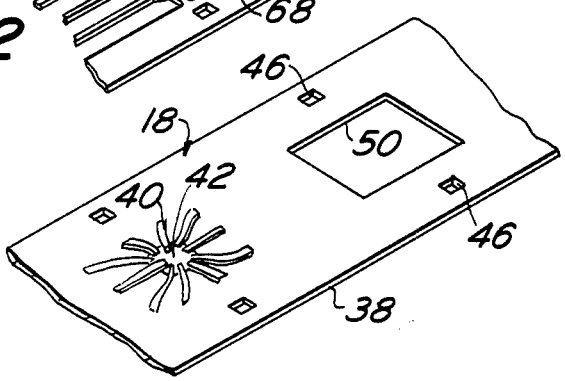
FIG. 11
FIG. 12

OUTER LEAD BONDER

RELATED APPLICATION

Hugh R. Harris and Alan S. Keizer, Ser. No. 510,207 filed Sept. 30, 1974.

BACKGROUND OF THE INVENTION

The present invention relates in general to bonding outer leads to inner leads and, more particularly, to an apparatus for automatically and accurately removing sets of inner leads and a die from a film carrier, moving the set into proper alignment with the outer leads and effecting a bond between the inner and outer leads.

To increase production and yield, the semi-conductor industry has sought to automate the processes for assembling integrated circuits and other semiconductor devices. These efforts have lead to the development of the film-carrier as a replacement for the widely used wire-bonding techniques. A film-carrier consists of a strip of plastic film having sprocket holes at its edges and carries the inner lead frames. The leads in each lead frame are simultaneously bonded to the bonding pads on the die by bonding apparatus. Sprocket holes along the sides of the film carrier function to provide a means to advance the film carrier after a die has been bonded to the leads. This allows the film carrier and dies to be taken up on a reel or the like for further processing.

The major advantage of the film-carrier technique over other bonding techniques is that it lends itself to full automation. The present invention is directed toward apparatus for automatically bonding film-carrier inner leads to outer leads. In particular, the present invention is concerned with apparatus for sequentially advancing inner lead frames mounted on a film carrier to a bonding site, sequentially advancing outer lead frames to the bonding site, removing a set of inner leads and the die bonded thereto from the film carrier and moving the set into a bonding position with the inner and outer leads properly aligned, and then effecting a bond between said leads. To accomplish this, the outer leads are sequentially fed to and accurately positioned at the bonding site. In a like manner, individual sets of inner leads and dies are sequentially advanced to the bonding site. A punch accurately removes a set of inner leads and associated die from the film carrier and moves it into proper alignment with the outer leads. Thereafter, a bonding tool bonds the inner leads to the outer leads such as by thermocompression bonding. Thereafter, the next outer lead frame and next set of inner leads and die are advanced to the bonding site. The foregoing is accomplished automatically, that is, without human intervention.

For the purpose of illustrating the invention, there is shown in the drawings a form which is presently preferred; it being understood, however, that this invention is not limited to the precise arrangements and instrumentalities shown.

FIG. 3 is a partial longitudinal sectional view of the bonder shown in FIG. 2 taken along the line 3—3.

FIG. 4 is an enlarged sectional view of a retaining mechanism for retaining the film carrier at the bonding site.

FIG. 9 is a side plan view of the bonding tool assembly and support therefor.

FIGS. 10 and 11 are a diagrammatic illustration of a part of the functional process performed by the bonder.

FIG. 12 is a perspective view of the outer lead frame stock and film-carrier.

Figure 1:
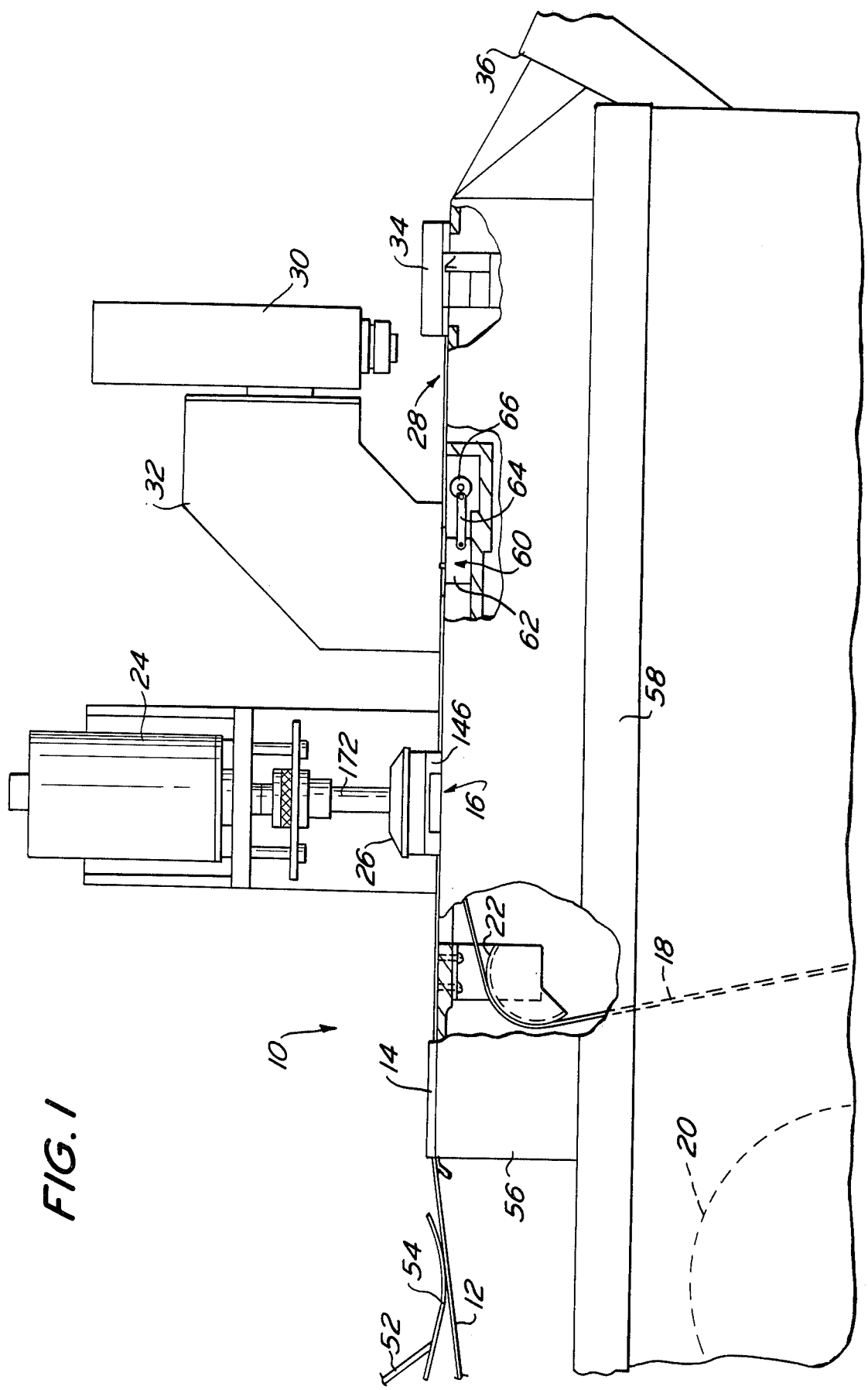
FIG. 1 is a partial front plan view of the outer lead bonder.
Figure 2:
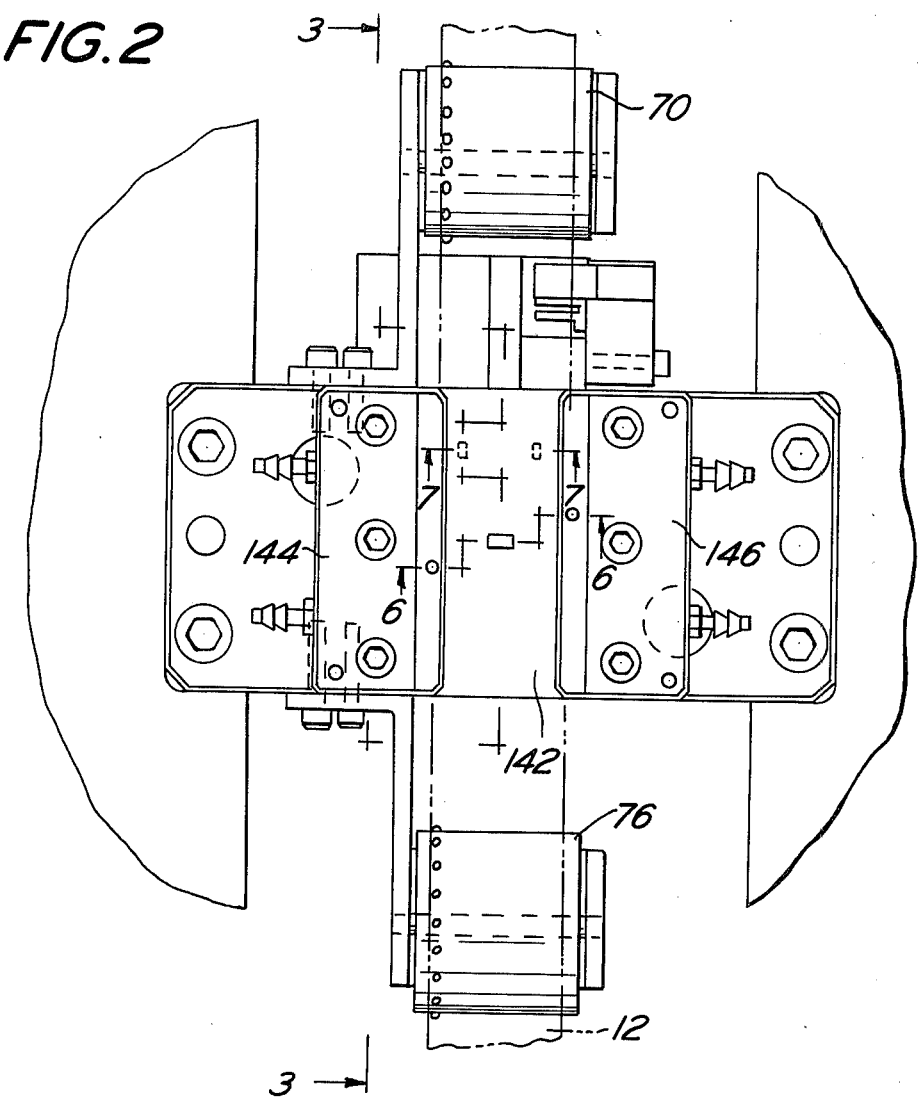
FIG. 2 is a partial top plan view of the outer lead bonder showing the bonding site.

Referring now to the drawings in detail, wherein like numerals indicate like elements, there is shown in FIG. 1 an outer lead bonder designated generally as 10. As shown, the outer lead frame stock 12 is fed from a supply spool (not shown) through a guide channel 14 to the bonding site 16. Film-carrier 18 is fed from the supply spool 20 over guide 22 to the bonding site 16. The film-carrier 18 supports sets of inner leads to which dies have been previously bonded. At the bonding site 16, individual sets of inner leads and dies are removed from the film carrier and raised to a position in mating alignment with the outer leads. The bonding tool assembly 24 supports a bonding tool 26 that effects a thermocompression bond between the inner and outer leads. Thereafter, the outer lead frames are advanced to the inspection site 28 where the quality of each bond is observed through the television camera 30 which is electronically connected to a television monitor (not shown). Television camera 30 is mounted on a support arm 32.

A shear mechanism 34 divides the outer lead frame stock into selected numbers of lead frames (e.g., 5) and they are thereafter automatically loaded into cartridges by the cartridge loading mechanism 36.

FIG. 12 illustrates the positional relationship between the outer lead frame stock 12 and the film-carrier 18 at the bonding site. As shown, the outer lead frame stock 12 is positioned directly above the film-carrier 18 so that the inner leads mounted thereon can be removed and raised to a position in alignment with the outer leads for bonding thereto. The film-carrier 18 is per se known in the art and generally comprises a plastic (e.g., polyimide) carrier 38 that has a series of inner lead frames 40 mounted on its surface. A die 42 has been previously bonded to each of the leads of the lead frame 40 by an apparatus and process such as described in U.S. Pat. application Ser. No. 510,207, filed Sept. 30, 1974 or by other known apparatus or processes.

Heretofore, the film-carrier 18 has been designed to a standard 16 mm format as defined by American National Standard Institute (ASNI). The 16 mm dimension refers to the width of the film. It should be understood, however, that the apparatus described hereto is not limited by any means to use with a 16 mm format with the film-carrier. An 11 mm format has also been used and there is no reason why any non-standard format could not be used by making appropriate dimensional adjustments in the outer lead bonder.

The carrier 38 is presently made of polyimide which is a thermo setting-type plastic characterized by its ability to withstand high temperatures and by its dimensional stability. Inner lead frames 40 are made of metal foil (e.g., copper, nickel, gold or a combination of them) which is bonded to the carrier 38 and etched to form the leads by a process not relevant to the description of the present invention. The inner end of each of the leads in lead frame 40 projects over a window in the carrier 38 and is bonded, as by thermocompression bonding, to the bonding pads on the die 42. (As used throughout this disclosure and the claims the term "die" refers to a semi-conductor device such as, by way of example, an integrated circuit. The terms "chip" and "die" are often interchangeably in the industry and are so used in this disclosure.)

The outer lead frame stock 12 comprises a plurality of outer lead frames 44 made of a metal which is, of itself, directly bondable or of a metal or alloy such as Kovar coated with a bondable metal. The structure and composition of such outer lead frames is well known in the art and need not be described in detail. It is sufficient to indicate that it includes a plurality of lead frames 44 and they are designed to be bonded to the inner leads 40 by known processes such as, for example, thermocompression bonding.

The film-carrier 18 is provided with sprocket holes 46 and the outer lead frame stock 12 is provided with sprocket holes 48.

Also illustrated in FIG. 12 is the fact that a set of inner leads 40a and die 42a have been removed from the carrier 48 and attached to the outer lead frame 44a. Removal is effected by the punch and cutting die mechanism described below leaving the opening 50 in the carrier 38.

Referring once again to FIG. 1, the outer lead frame stock 12 is fed from a motor driven reel (not shown) and passes under the arm 52 which supports a curved surface 54 against the top surface of the outer lead frame stock 12. The position of arm 52 as determined by the amount of slack in the lead frame stock 12 provides a control signal for a motor to de-reel the lead frame stock 12. The outer lead frame stock 12 passes through a guide channel 14 which locates it on the support base 56 mounted on table 58. Outer lead frame stock 12 is moved through the bonding site 16 by the use of a reciprocating feed mechanism 60. Feed mechanism 60 may, for example, include a reciprocating shuttle 62 driven by a crank 64 eccentrically connected to the output shaft of a motor 66. Pawls on the shuttle 62 may engage the stock 12 in the sprocket holes 48 to sequentially advance each lead frame 44 to the bonding site. If desired, the feed mechanism may be constructed like the hitch-feed assembly 80, FIG. 8.

Since the outer lead frame stock 12 is made of metal, it can be manufactured to close tolerances which it retains throughout the entire manufacturing processes. Accordingly, the stock feed mechanism 60 can accurately position each window 68 in the lead frames 44 at the bonding site.

The film carrier 18 is de-reeled from the spool 20 by a motor (not shown) that is controlled by the position of an arm (also not shown) in the same manner as the arm 52 controls the motor which de-reels the outer lead frame stock 12.

The film-carrier 18 passes over the guide 22 and the sprocket wheel 70 rotatably mounted on the arm 72 as shown in FIG. 3. Sprocket wheel 70 engages the film carrier 18 in sprocket holes 46 and provides accurate lateral alignment of the film-carrier with the entrance side of the die holder 84. Film-carrier 18 passes from the exit side of the die holder 74 over the sprocket wheel 76 rotatably mounted on the arm 78. Sprocket wheel 76 maintains lateral alignment of the film-carrier on the exit side of die holder 74.

Figure 8:
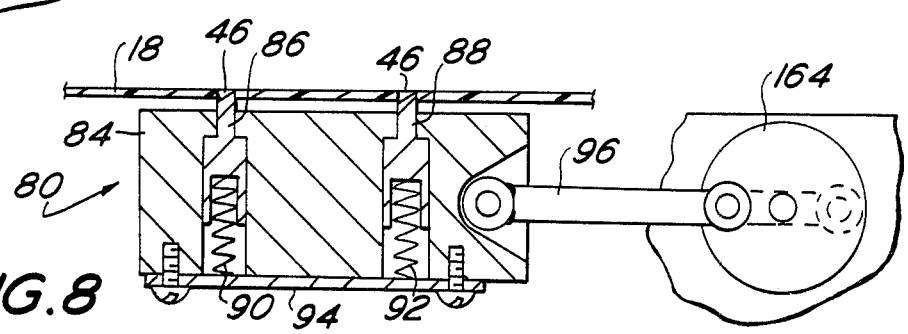
FIG. 8 is a transverse sectional view of the hitch feed for the film carrier.

Referring to FIG. 8, there is shown a hitch-feed assembly 80 for advancing the film-carrier 18 over the die holder 74 to sequentially bring each set of inner leads 40 and die 42 into position over the punch 82 at the bonding site 16. The hitch feed assembly 80 includes a shuttle 84 mounted on a guide (not shown) for reciprocatory motion. Mounted with each shuttle 84 are four pawls of which pawls 86 and 88 are shown. Pawls 86 and 88 are normally biased by springs 90 and 92 so that the shoulders formed therein bear against the mating shoulders at the bottom of the holes in which they are slidably mounted. A plate 94 fixed to the shuttle 84 retains the springs and hence the pawls 86 and 88 within the shuttle.

The shuttle 84 is reciprocated by the motor driven crank 96. The spring force applied by springs 90 and 92 to the pawls 86 and 88 is just sufficient to overcome sliding friction and normally bias them to the position shown in FIG. 8. The bevel cam surface at the end of each pawl 86 and 88 permits them to readily move out of the sprocket holes 46 so that the shuttle can return to the home position as shown. The displacement of the shuttle 84 is set to advance the film-carrier 18 slightly more than one inner lead frame to bring it just past the punch 82 as explained in more detail below.

Punch 82 is fixed to a guide plate 98 that in turn is mounted on a roller retainer 100. Roller retainer 100 supports a shaft 102 to which is rotatably attached the roller cam 104. Roller cam 104 rides on cam 106 which is slidably retained in cam guide 108 by cam rails 110 and 112. The entire cam assembly described above is bolted to a T support 114.

Bracket 116 supports photocells 118 which are used to sense the position of the cam 106 by detecting the flag 120.

Cam 106 is coupled through an aligning coupler 122 to the actuator 124 which is connected to a piston within an air cylinder (not shown). Displacement of the actuator 124 by means of a force applied by the air cylinder causes the cam 106 to reciprocate within the cam guide 108 thereby raising the punch 82. Punch 82 is shown in the raised position in FIG. 5.

The guide plate 98 slides on guide pins 126 and 128 which are fixed in the die holder 74. Compression springs 130 and 132 provide a force on the guide plate 98 thereby maintaining the roller cam 104 in contact with the cam 106.

As best shown in FIG. 3, downward movement of the guide plate 98 and hence the punch 82 is adjustably limited by the shoulder screw 134 threadably mounted in the pressure pad 136. Spring 138 provides additional force on the guide plate 98.

Figure 6:
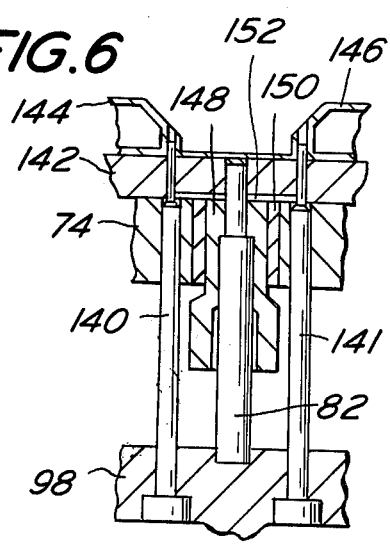
FIG. 6 is an enlarged transverse sectional view of the punch and die taken along the line 6—6 in FIG. 2.

Referring to FIG. 6, a pair of pilot pins 140 and 141 are fixed to the guide plate 98. The pilot pins 140 and 141 extend through the die holder 74 and the cutting die 142. They terminate within bores in the guide rails 144 and 146. The pilot pins 140 and 141 are shown in their raised position in FIG. 6. In this position, they engage the outer lead frame stock 12 in the sprocket holes 48 to hold it in position during bonding. The pilot pins 140 and 141 pass to the side of the film-carrier 18 which is narrower in width than the outer lead frame stock 12.

Guide rails 144 and 146 are hollow so that they may be water cooled. This provides a means for rapidly removing heat from the bonding site once the bond has been efected. It also helps cool the cutting die 142.

As shown, die holder 74 supports appropriate bushings 148 and 150 for guiding the punch 82.

Cutting die 142 is mounted on the die holder 74 and together they define the slot 152 through which the film-carrier 18 passes. The width and depth of slot 152 are precisely equal to the width and thickness of the film-carrier 18. A slot to accommodate the chips is also provided. In this manner, the force of the punch 82 on the film-carrier permits the cutting die 142 to cleanly shear off a set of inner leads and die bonded thereto. This occurs when the cam 106 raises the punch 82. The height of cam 106 is such that it raises the top of punch 82 so as to bring the set of inner leads and die into juxtaposition with a lead frame 44.

Figure 7:
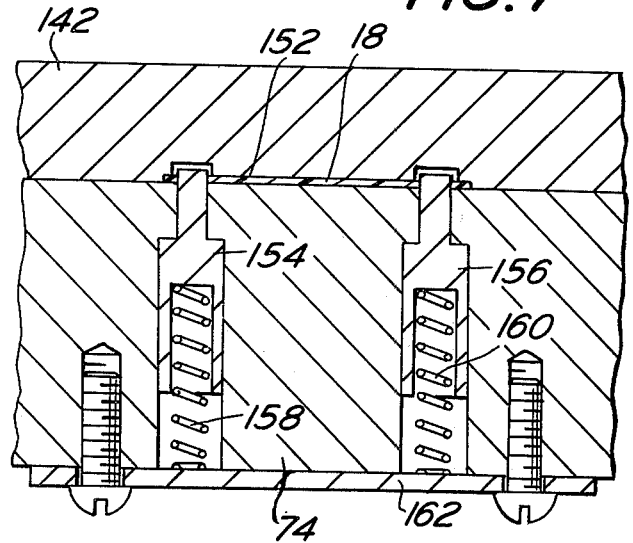
FIG. 7 is an enlarged transverse sectional view of the film-carrier retaining mechanism taken along the line 7—7 in FIG. 2.

Referring now to FIGS. 4 and 7, there is shown the mechanism for accurately assuring the longitudinal positioning of the film-carrier 18 within the slot 152. As shown, a pair of pawls 154 and 156 are retained within bores in the die holder 74 by the springs 158 and 160 and the plate 162. The pawls 154 and 156 have bevel cam surfaces which permit the film-carrier 18 to advance from the entrance side to the exit side of the die holder but block retraction by engaging the film-carrier in the sprocket holes 46. The force applied by springs 158 and 160 is just sufficient to overcome the sliding friction of the pawls 154 and 156 so that they are normally biased to the position shown in FIG. 7. Thus, the film-carrier 18 readily advances without unnecessary friction being applied by the pawls.

The function of the pawls 154 and 156 is to precisely fix the film-carrier 18 in position prior to and during the bonding operation. This permits the inner leads and die set to be accurately punched from the film-carrier and raised to the bonding position adjacent to the repositioned outer lead frame 44.

By means of a spring loaded arm, a slight tension is maintained on the film-carrier 18 thus always tending to bias it back towards the spool 20. This tension is used in cooperation with the hitch feed assembly 80 to maintain the film-carrier 18 in position against the pawls 154 and 156. The crank 96 is eccentrically connected to the plate 164 which is motor driven. The resulting reciprocatory displacement of the shuttle 84 is adjusted to be slightly more than the pitch between two chips bonded to inner leads 40 on the film-carrier 18. While the shuttle 18 is returning to the home position shown in FIG. 8, the pawls 86 and 88 are not engaged in sprocket holes. Due to the overadvance of the film-carrier, the pawls 154 and 156 are not engaged in sprocket holes either. Accordingly, the normal tension on the film carrier tends to draw it from the exit side back toward the entrance side of the die holder 74. This retraction continues until the pawls 154 and 156 engage the film-carrier in the sprocket holes. Thus, proper longitudinal alignment of the film-carrier 18 and hence of the set of inner leads and chip over the punch 82 is provided for.

The bonding tool assembly 24 is mounted in an overarm support 166 which is hingedly connected to the base 56 by the hinge 168. This permits the bonding tool assembly to be swung out of the way for ready access to the bonding site 16. Thumb screw 170 bolt the casting 166 in position during the bonding operation.

The bonding tool assembly includes pneumatic apparatus (not shown) for applying pressure to move the heated bonding tool 26 into engagement with the outer and inner leads to effect a thermocompression bond at the bonding site 16. It should be understood that this invention is not limited to use with thermocompression bonding apparatus. Other methods of bonding such as soldering and eutectic bonding may also be used. Thermocompression bonding, as the name implies, employs heat and pressure to create adhesion between the mating parts. It is a solid state bond based upon the principles of cross diffusion of the molecules; that is there is no melting of the mating parts.

Since the pneumatic apparatus for applying pressure to the bonding tool 26 plays no part in the present invention, it is not described in detail. It should be understood that commercially available pneumatic apparatus can be used for this purpose. The bonding tool 26, as best shown in FIG. 3, is mounted on the end of the ram 172 and is provided with a heating element 174. The bonding tool is shaped to engage the mating parts of the outer and inner leads and apply both heat and pressure to effect a thermocompression bond.

The outer lead bonder described above functions in the following manner. The film-carrier 18 and outer lead frame stock are set into the outer lead bonder 10 and initially aligned. The cam 106 is displaced to the right of the position shown in FIG. 5 so that the punch 82 is withdrawn below the level of the film-carrier 18. In a like manner, the bonding tool 26 is reciprocated so as to be out of contact with the outer lead frame stock 12.

Figure 5:
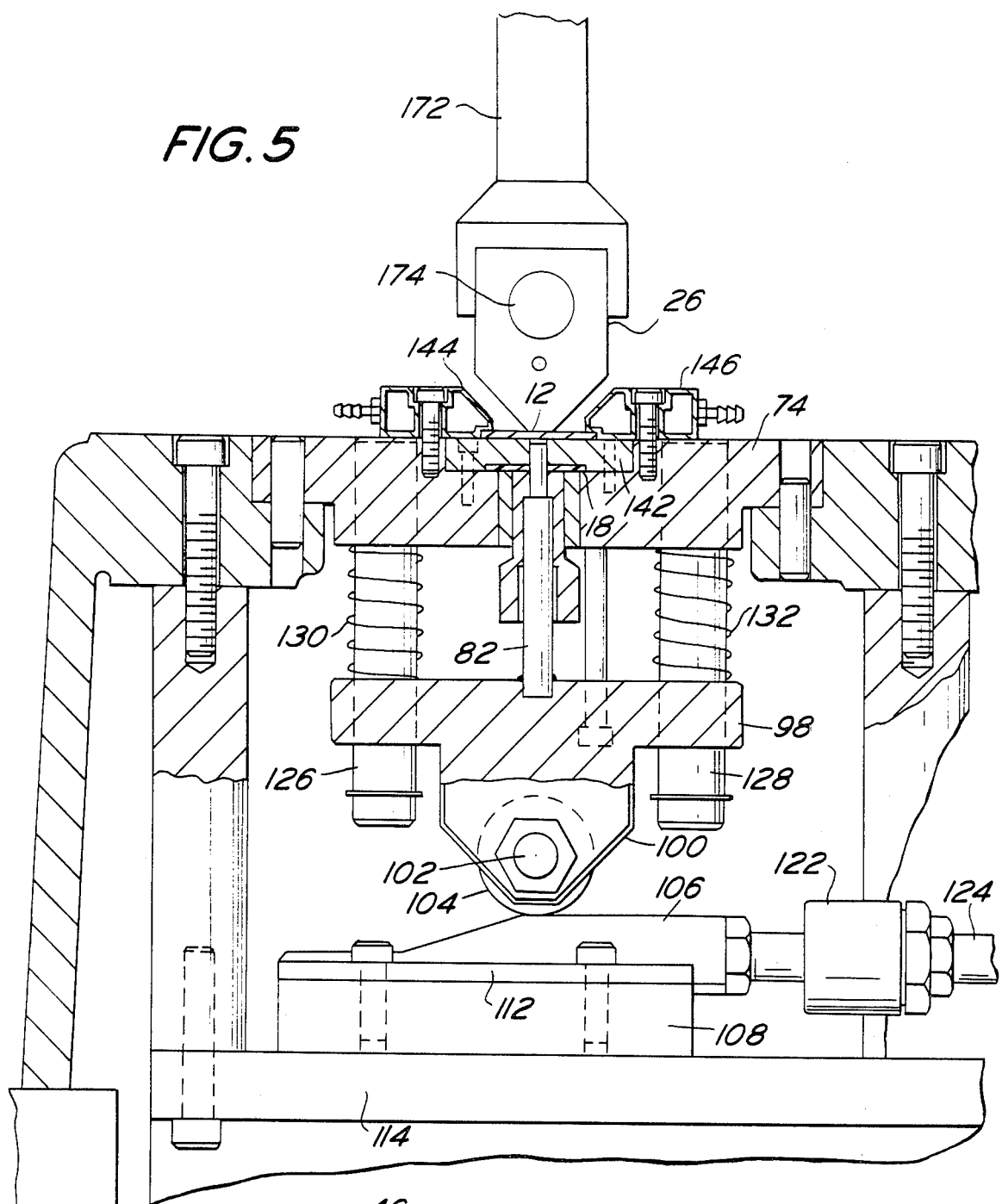
FIG. 5 is a transverse sectional view of the bonder taken along the line 5—5 in FIG. 3.

Upon initiation of the process, the cam 106 moves to the position shown in FIG. 5 thereby raising the punch 82. As diagrammatically illustrated in FIGS. 10 and 11, this force punches out the die 42 and the inner leads 40 by means of the shearing force applied by the cutting die 142.

The set of inner leads and die rests on top of the punch 82 and is raised as shown in FIG. 11 into precise alignment with the outer leads in the lead frame 44. The punch 82 provides three functions. It removes the set of inner leads and die from the film-carrier 18 and raises them to the bonding position at the bonding site. Moreover, it provides a base for supporting the mating inner and outer leads during the bonding operation.

The bonding operation is effected by bringing the bonding tool 26 into contact with the surface of the outer leads in mating alignment with the inner leads. Once the bond has been made, the bonding tool is withdrawn and both the film-carrier 18 and the outer lead frame stock 12 are advanced. This brings the next adjacent outer lead frame and set of inner lead frame and die into position. Accurate alignment is automatically achieved as explained above.

The present invention may be embodied in other specific forms without departing from the spirit or essential attributes thereof and, accordingly, reference should be made to the appended claims, rather than to the foregoing specification as indicating the scope of the invention.

We claim:

1. Apparatus for thermocompression bonding of outer leads within a lead frame to inner leads on a film carrier, said inner leads having previously been bonded to a semi-conductor chip, comprising:

means for sequentially advancing a continuous strip of outer lead frames to position individual lead frames at a thermocompression bonding site;

means for sequentially advancing a continuous strip of film carrier supporting the inner leads and the individual semiconductor chips bonded thereto to bring individual sets of inner leads and a chip to the bonding site in alignment with the outer leads of the outer lead frame for mating engagement of individual ones of said inner and outer leads for thermocompression bonding to each other;

lead frame guide means for laterally positioning the strip of outer lead frames at the bonding site;

a die holder and die supported in juxtaposed relation to define a slot through which the film carrier is advanced, said slot providing means to precisely, laterally align the inner leads on said film carrier strip at the bonding site;

a reciprocable punch for shearing the film carrier at the bonding site and displacing the chip and leads into mating engagement with the outer leads at the bonding site;

a reciprocable bonding tool for movement to the bonding site while said inner leads are held in engagement with the outer leads and thermocompression bonding individual ones of said engaged inner and outer leads to each other;

pilot pin means reciprocable with said punch for engaging said lead frame strip in holes therein and fixing said outer lead frame during bonding; and longitudinal alignment means for accurate longitudinal alignment of the film carrier at the bonding site including reciprocable pawls for engaging the film carrier in sprocket holes, means for biasing said film carrier in the direction opposite to the direction of advance by the advancing means, and said advancing means including means to overadvance the film carrier and then release it so that the biasing means moves it back toward the bonding site until it is engaged by the pawls.

2. Apparatus in accordance with claim 1 including means for reciprocating said punch, said reciprocating means comprising a roller cam mounted on support means for said punch, and a reciprocable sliding wedge-shaped cam for displacing said roller cam upon reciprocable movement of said slidable cam, and means for reciprocably displacing said slidable cam.

3. Apparatus in accordance with claim 1 wherein said outer lead frame guide means comprises a pair of guide rails which define lateral slots through which said outer lead frame strip passes, said slots engaging the lead frame at the sides and partially on top thereof adjacent to the bonding site for guiding said lead frame in proper alignment at the bonding site.

4. Apparatus for thermocompression bonding of outer leads within a lead frame to inner leads on a film carrier, said inner leads having previously been bonded to a semi-conductor chip, comprising:

means for sequentially advancing a continuous strip of outer lead frames to position individual lead frames at a thermocompression bonding site;

means for sequentially advancing a continuous strip of film carrier supporting the inner leads and the individual semiconductor chips bonded thereto to bring individual sets of inner leads and a chip to the bonding site in alignment with the outer leads of the outer lead frame for mating engagement of individual ones of said inner and outer leads for thermocompression bonding to each other;

lead frame guide means for laterally positioning the strip of outer lead frames at the bonding site;

a die holder and die supported in juxtaposed relation to define a slot through which the film carrier is advanced, said slot providing means to precisely, laterally align the inner leads on said film carrier strip at the bonding site;

a reciprocable punch for shearing the film carrier at the bonding site and displacing the chip and leads into mating engagement with the outer leads at the bonding site;

a reciprocable bonding tool for movement to the bonding site while said inner leads are held in engagement with the outer leads and thermocompression bonding individual ones of said engaged inner and outer leads to each other;

longitudinal alignment means for accurate longitudinal alignment of the film carrier at the bonding site including reciprocable pawls for engaging the film carrier in sprocket holes, means for biasing said film carrier in the direction opposite to the direction of advance by the advancing means, and said advancing means including means to overadvance the film carrier and then release it so that the biasing means moves it back toward the bonding site until it is engaged by the pawls.

5. Apparatus for thermocompression bonding of outer leads within a lead frame to inner leads on a film carrier, said inner leads having previously been bonded to a semi-conductor chip, comprising:

means for sequentially advancing a continuous strip of outer lead frames to position individual lead frames at a thermocompression bonding site;

means for sequentially advancing a continuous strip of film carrier supporting the inner leads and the individual semiconductor chips bonded thereto to bring individual sets of inner leads and a chip to the bonding site in alignment with the outer leads of the outer lead frame for mating engagement of individual ones of said inner and outer leads for thermocompression bonding to each other;

lead frame guide means for laterally positioning the strip of outer lead frames at the bonding site;

a die holder and die supported in juxtaposed relation to define a slot through which the film carrier is advanced, said slot providing means to precisely, laterally align the inner leads on said film carrier strip at the bonding site;

said lead frame being positioned at the bonding site on one operative side of the die, and the slot through which said film carrier passes being on the opposite operative side of said die;

a reciprocable punch for shearing the film carrier at the die and lifting the chip and inner leads through an opening in the die to mating engagement with the outer leads at the bonding site on said opposite side of the die, whereby said opening in said die guides the chip on the distal end of the punch to the bonding site and said punch holds said chip in position at the bonding site; and a reciprocable bonding tool for movement to the bonding site while said inner leads are held in engagement with the outer leads and thermocompression bonding individual ones of said engaged inner and outer leads to each other.

6. Apparatus in accordance with claim 1 wherein said outer lead frames are positioned over the inner lead frames at the bonding site.

* * * * *